United States Patent
Cok et al.

(10) Patent No.: US 8,013,525 B2
(45) Date of Patent: Sep. 6, 2011

(54) FLEXIBLE OLED DISPLAY WITH CHIPLETS

(75) Inventors: Ronald S. Cok, Rochester, NY (US);
John W. Hamer, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 315 days.

(21) Appl. No.: 12/421,137

(22) Filed: Apr. 9, 2009

(65) Prior Publication Data

US 2010/0259166 A1    Oct. 14, 2010

(51) Int. Cl.
*H01J 1/62* (2006.01)
*H01J 63/04* (2006.01)

(52) U.S. Cl. .......... 313/511; 313/498; 445/25

(58) Field of Classification Search .......... 313/511, 313/498
See application file for complete search history.

(56) References Cited

U.S. PATENT DOCUMENTS

| | | | |
|---|---|---|---|
| 6,384,529 B2 | 5/2002 | Tang et al. | |
| 6,590,346 B1 * | 7/2003 | Hadley et al. | 315/169.3 |
| 7,037,352 B2 | 5/2006 | Ito et al. | |
| 7,449,135 B2 | 11/2008 | Yu et al. | |
| 7,466,390 B2 | 12/2008 | French et al. | |
| 2004/0252251 A1 | 12/2004 | Credelle et al. | |
| 2006/0055864 A1 | 3/2006 | Matsumura et al. | |
| 2006/0163559 A1 | 7/2006 | Koganei et al. | |
| 2006/0210769 A1 | 9/2006 | Swindlehurst et al. | |
| 2007/0079571 A1 | 4/2007 | Schatz | |
| 2010/0201253 A1 * | 8/2010 | Cok et al. | 313/498 |

FOREIGN PATENT DOCUMENTS

| | | |
|---|---|---|
| WO | 2010/019185 A1 | 2/2010 |
| WO | 2010/098992 A1 | 9/2010 |

OTHER PUBLICATIONS

Affinito, J.D., et al., *Ultrahigh rate, wide area plasma polymerized films from high molecular weight/low vapor pressure liquid or solid monomer precursors,* Journal of Vacuum Science and Technology: Part A, vol. 17, No. 1, Jul. 1, 1999, pp. 1974-1981.

* cited by examiner

*Primary Examiner* — Nimeshkumar Patel
*Assistant Examiner* — Glenn Zimmerman
(74) *Attorney, Agent, or Firm* — Morgan, Lewis & Bockius LLP

(57) ABSTRACT

A flexible emissive device, includes a flexible rough substrate having a rough substrate surface and defining a display area; an organic low-temperature adhesion layer formed on the rough substrate surface, at least a portion of the organic low-temperature adhesion layer having a thickness greater than or equal to five microns; a plurality of chiplets distributed in the display area and adhering to the organic low-temperature adhesion layer, each chiplet having one or more connection pads; a plurality of patterned bottom electrodes formed over the organic low-temperature adhesion layer in the display area, each bottom electrode being electrically connected to only one connection pad of a corresponding chiplet; one or more layers of light-emitting material formed over the bottom electrode; and a top electrode formed over the one or more layers of light-emitting material; and a flexible encapsulating layer located over the top electrode and adhered to the rough substrate surface.

19 Claims, 4 Drawing Sheets

FLEXIBLE OLED DISPLAY WITH CHIPLETS

CROSS REFERENCE TO RELATED APPLICATIONS

Reference is made to commonly-assigned, U.S. patent application Ser. No. 12/191,462, filed Aug. 14, 2008, entitled "Display Device With Chiplets" by Cok et al; U.S. patent application Ser. No. 12/271,952 filed Nov. 17, 2008 entitled "Emissive Device With Chiplets" by Cok et al and U.S. patent application Ser. No. 12/369,163 filed Feb. 11, 2009, entitled "Display Device With Chiplets and Light Shields" by Cok et al, the disclosures of which are incorporated herein.

FIELD OF THE INVENTION

The present invention relates to a flexible light-emitting device employing independent control elements having separate substrates distributed over a flexible rough substrate.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored, light-emitting elements commonly referred to as sub-pixels, typically emitting red, green, and blue light, to represent each image element. A variety of flat-panel display technologies are known, for example plasma displays, liquid crystal displays, and light-emitting diode displays. In recent years, there has been an increased interest in flexible flat-panel display devices.

Light emitting diodes (LEDs) incorporating thin films of light-emitting materials forming light-emitting elements (pixels) have many advantages in a flat-panel display device and are useful in optical systems. U.S. Pat. No. 6,384,529 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, charge transport, or charge blocking to the light-emitting-thin-film materials, and are known in the art. The materials are placed upon a substrate between electrodes, with an encapsulating cover layer or plate. Light is emitted from a sub-pixel when current passes through the light-emitting material. The frequency of the emitted light is dependent on the nature of the material used. In such a display, light can be emitted through the substrate (a bottom emitter) or through the encapsulating cover (a top emitter), or both.

Two different methods for controlling the pixels in a flat-panel display device are generally known: active-matrix control and passive-matrix control. In an active-matrix device, control elements are distributed over the flat-panel substrate. Typically, each sub-pixel is controlled by one control element and each control element includes at least one transistor. For example, in a simple, prior-art active-matrix organic light-emitting (OLED) display, each control element includes two transistors (a select transistor and a power transistor) and one capacitor for storing a charge specifying the luminance of the sub-pixel. Each light-emitting element typically employs an independent control electrode and a common electrode.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices are formed at high temperatures (e.g. >300° C. for amorphous silicon and >500° C. for large-grain polysilicon) and typically exhibit local or large-area non-uniformity across the glass substrate that results in non-uniformity in the electrical performance and visual appearance of displays employing such materials. Thin-film transistors made of organic materials (OTFTs) have lower performance than silicon TFTs and are more susceptible to moisture but are processed at lower temperatures (e.g. <200° C.) (e.g. U.S. Patent Application Publication No. 2006/0163559). All TFTs, however, require a very smooth substrate to avoid forming inoperable or dysfunctional elements.

Flexible substrates made of plastic are relatively transparent but have many limitations. Such substrates typically physically degrade at temperatures greater than 300° C. or even at 250° C. or 200° C. Hence processing the substrate, or materials deposited on the substrate, is very difficult. For example, conventional PEN has a process temperature of approximately 150° C. and PET has a process temperature of approximately 120° C. Furthermore, plastics can have limited resistance to chemicals and processes used in conventional photolithography, thereby limiting the kinds of materials and processing employed with the substrates. Such substrates are also know to have poor dimensional stability with varying process temperatures, stress, and relative humidity, thereby limiting the resolution of structures formed on the substrate. Plastic substrates are also subject to permeation of oxygen and water vapor that can degrade organic materials such as OLED materials. Moreover, as noted in U.S. Pat. No. 7,466,390, it is difficult to form plastics that are smooth and clean enough to serve as a substrate for the formation of thin-film electronic elements, such as those commonly used for flat-panel displays, e.g. thin-film silicon transistors. Catalytic byproducts and inorganic particulates in the polymers and inadequate process conditions all affect surface roughness. For soft materials such as polymers, artifacts such as scratches or foreign contaminants can be problematic.

Commercial flexible substrate and cover products incorporating plastics with multi-layer barriers are now available that have a greatly reduced susceptibility to moisture permeation, for example from 3M. Such multi-layers typically employ alternating organic and inorganic layers. Plastics can also be heat stabilized to improve their dimensional stability and temperature range (see, e.g. U.S. Pat. No. 7,449,135). Such products, however, are still relatively rough, face many of the difficulties listed above, and are inadequate for thin-film display devices using thin-film transistors without additional stabilization and surface treatments.

An alternative approach to providing flexible substrates is to use metal foils. Metal foils have the advantages of moisture impermeability, a lower coefficient of thermal expansion, and are relatively inexpensive as well as compatible with high process temperatures of, for example 900° C. Metal foils, for example steel or aluminum foil, however, are opaque and thus cannot serve as both a substrate and cover in a flat-panel display device (since light must escape from a flat-panel display). Metal foils are also very rough and require a smoothing process or the use of a planarization layer or annealing processes to provide a surface with adequate smoothness to support the formation of thin-film electronic components (e.g. as described in U.S. Pat. No. 7,037,352). For example, typical steel foil has an rms (root mean square) roughness of >600 Angstroms. By forming an inorganic layer of silicon dioxide by PECVD on the steel foil surface, the rms roughness can be reduced in half, for example to >300 Angstroms. Other techniques, for example chemical or mechanical polishing, can reduce the rms roughness by more than an order of magnitude, for example >20 Angstroms. Further treatments can reduce the rms roughness to >10 Angstroms and can be as smooth as the commercially available substrate glass, e.g. Corning Eagle 2000. An rms surface roughness of less than 10 Angstroms is adequate for thin-film transistor formation. Steel foils can also be planarized by using spin-on-glass techniques, possibly employing several layers and materials such as polyimide. Hence, metal foil substrates can be made smooth enough to support conventional thin-film transistor processing and performance.

In general, for both plastic and metal substrates, the thickness of the planarizing coatings is less than one micron. However, such smoothing processes are expensive and time consuming. Moreover, the costs of the substrates increase if additional treatments to stabilize the substrate materials are necessary.

Matsumura et al describe crystalline silicon substrates used for driving LCD displays in US Patent Application Publication No. 2006/0055864. The application describes a method for selectively transferring and affixing pixel-control devices made from first semiconductor substrates onto a second planar display substrate. Wiring interconnections within the pixel-control device and connections from busses and control electrodes to the pixel-control device are shown. However, these substrates are relatively thick and not well adapted to flexible devices.

There is a need, therefore, for an emissive display device having improved performance and flexibility and reduced manufacturing process and material requirements.

SUMMARY OF THE INVENTION

In accordance with the invention, a flexible emissive device, comprising:

(a) a flexible rough substrate having a rough substrate surface and defining a display area;

(b) an organic low-temperature adhesion layer formed on the rough substrate surface, at least a portion of the organic low-temperature adhesion layer having a thickness greater than or equal to five microns;

(c) a plurality of chiplets distributed in the display area and adhering to the organic low-temperature adhesion layer, each chiplet having one or more connection pads;

(d) a plurality of patterned bottom electrodes formed over the organic low-temperature adhesion layer in the display area, each bottom electrode being electrically connected to only one connection pad of a corresponding chiplet; one or more layers of light-emitting material formed over the bottom electrode; and a top electrode formed over the one or more layers of light-emitting material; and (e) a flexible encapsulating layer located over the top electrode and adhered to the rough substrate surface.

The present invention provides a simplified structure for a flexible light-emitting diode device with higher performance and improved flexibility. This invention permits the use of a substrate having a rough surface that reduces the need for substrate processing to provide a smooth substrate surface, thereby reducing manufacturing process requirements and enabling the use of a wider variety materials.

Figure 1:
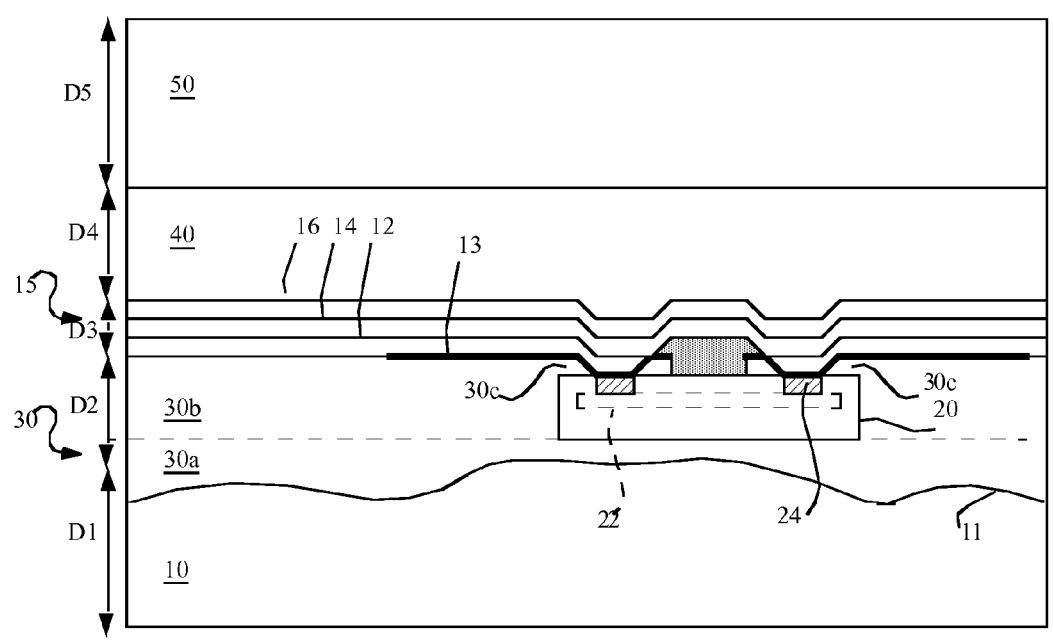
FIG. 1 is a partial cross-section of a device according to an embodiment of the present invention.

Because the various layers and elements in the drawings have greatly different sizes, the drawings are not to scale.

DETAILED DESCRIPTION OF THE INVENTION

Figure 3:
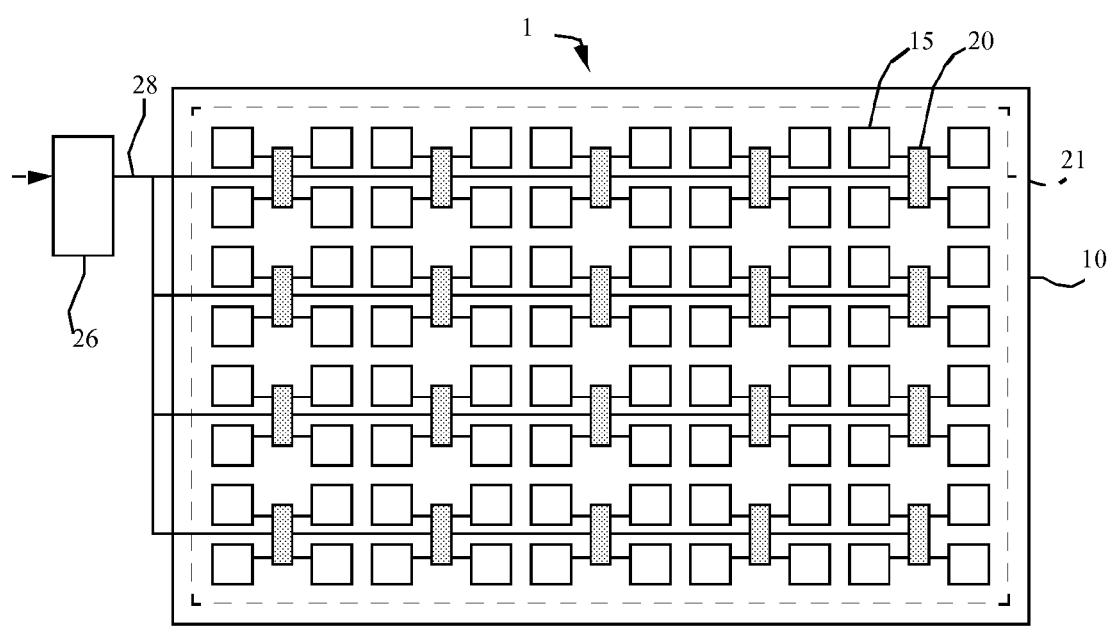
FIG. 3 is a plan view of a device according to another embodiment of the present invention.

Referring to FIG. 1, a flexible emissive device 1 includes a flexible rough substrate 10 having a rough substrate surface 11. A display area 21 is defined over the flexible rough substrate 10 (FIG. 3). An organic low-temperature adhesion layer 30 is formed on the rough substrate surface 11, at least a portion of the organic low-temperature adhesion layer 30 having a thickness D2 greater than or equal to 5 microns. A plurality of chiplets 20 are adhered to the rough substrate surface 11, each chiplet 20 having one or more connection pads 24 and the plurality of chiplets 20 distributed in the display area 21. A plurality of patterned bottom electrodes 12 are formed over the organic low-temperature adhesion layer 30 in the display area 21, each bottom electrode 12 is electrically connected to a connection pad 24 of one chiplet 20. One or more layers 14 of light-emitting material are formed over the bottom electrode 12 and a top electrode 16 is formed over the one or more layers 14 of light-emitting material. The electrodes 12, 16, and layers 14 of light-emitting material form a light-emitting diode 15.

A flexible encapsulating layer 50 is located over the top electrode 16 and adhered to the rough substrate surface 11. The flexible encapsulating layer 50 can be directly formed on the top electrode 16 (or layers formed on the top electrode 16) or can be a separate substrate (e.g. a cover). An optional polymer buffer layer 40 can be formed over the top electrode 16 (or layers formed on the top electrode 16) and the flexible encapsulating layer 50 formed over the polymer buffer layer 40 to form a completely solid-state flexible emissive device 1.

A rough substrate surface 11 as used herein is a substrate surface having a roughness great enough to prevent the effective formation of thin-film transistors, for example including inorganic material such as silicon or organic material such as pentacene. The flexible rough substrate 10 can be a metal (e.g. stainless steel foil) or a polymer (e.g. PEN or PET) possibly with inorganic layers interdigitated between polymer layers. Metal foils can have an rms roughness of 300-600 Angstroms. With additional treatment, rms roughnesses of 50-300 Angstroms or more can be obtained. In accordance with the invention, it has been determined that if the surface of the flexible substrate has an rms roughness of 100 Angstroms or more, the formation of effective thin-film transistors is inhibited.

An organic low-temperature adhesion layer of the present invention is a low-temperature adhesive layer formed of organic materials that are deposited at less than 200° C. and that degrade at temperatures greater than 200° C. Furthermore, the organic low-temperature adhesion layer 30 can include material that can be deposited and cured at similar low temperatures, for example 200° C., and likewise degrade at higher temperatures than, for example 200° C., without compromising the flexible emissive device 1 performance. In other embodiments of the present invention, the organic low-temperature adhesion layer 30 can be formed at room temperature, for example temperatures from 20° C. to 40° C.

The organic low-temperature adhesion layer 30 can include, for example, an adhesive polymer that can be cured by radiation or low-temperature heat, e.g. at temperatures less than 200° C. Some curable polymers can be cured at temperatures of 100° C. and are useful for the present invention. The organic low-temperature adhesion layer 30 can be flexible. The organic low-temperature adhesion layer 30 can include a multi-layer having at least two sublayers of the same material, a first sublayer 30a that can serve as a surface on which the chiplets 20 are initially adhered, and a burying sublayer 30b that buries the chiplet 20 and has at least a portion 30c of the low-temperature adhesion layer 30 covering at least a portion of the chiplet 20. The adhesive sublayer 30a only need be thick enough to provide adequate adhesion for the chiplet 20. Since the chiplet 20 is relatively large (e.g. 20 microns by 100 microns to 40 microns by 250 microns) compared to the roughness of the flexible rough substrate surface 11, the chiplet 20 will be adhered largely flat. The substrate surface roughness does not inhibit the adhesion of the chiplet 20 to the rough substrate surface 11. Both the sub-layers of the bi-layer can be cured at the same time to form one indistinguishable structure formed of a single material.

The chiplets 20 can be formed in crystalline silicon and include circuits 22 connected to connection pads 24 to drive the light-emitting diodes 15 with a performance much better than the performance of thin-film transistors. Because the present invention employs chiplets 20 that are not formed on the flexible rough substrate 10, unlike thin-film transistors, there is no need for a smooth substrate surface in an active-matrix device as taught in the prior art. However, the organic low-temperature adhesion layer 30 must have a thickness adequate to both adhere the chiplets 20 and provide a surface on which the layers 14 of light-emitting materials can be functionally deposited. The chiplet 20 generally has a thickness greater than or equal to 5-20 microns. Larger chiplets with a thickness of 50 or 100 microns can also be employed with the thickness of the organic low-temperature adhesion layer consequently increased. The organic low-temperature adhesion layer 30 must then have a complementary thickness of 5-100 microns. In one embodiment of the present invention, at least a portion 30c of the organic low-temperature adhesion layer 30 extends over at least a portion of the chiplet 20 to hold it firmly in place. While the illustration of FIG. 1 shows the organic low-temperature adhesion layer 30 with a thick, planarizing surface, it is not necessary that the organic low-temperature adhesion layer surface be completely smooth, only that the surface be sufficiently free of sharp changes in thickness that might short-circuit the top and bottom electrodes 16, 12.

The present invention also provides an advantage in that the flexible rough substrate 10 need not be subjected to high processing temperatures, such as are found, for example, in silicon thin-film transistor photolithographic processes. Low-temperature poly-silicon thin-film transistor photolithographic processes, for example, typically employ temperatures in excess of 800° C. Amorphous silicon thin-film transistor photolithographic processes, for example, typically employ temperatures in excess of 300° C. Since the chiplets 20 provide the circuitry 22 for driving the LEDs 15, the flexible rough substrate 10 is not subject to such high temperatures and the flexible emissive device 1 still has a very high performance. Hence, the flexible rough substrate 10 can include inexpensive materials that can be formed at relatively lower temperatures, for example 150° C., 200° C., or 250° C.

The flexible rough substrate 10 can also include inexpensive materials that degrade at relatively lower temperatures, for example 150° C., 200° C., or 250° C. As a material degrades, for example, dimensional stability is affected, it becomes less transparent, loses mechanical integrity, or is more permeable to moisture.

Figure 2A:
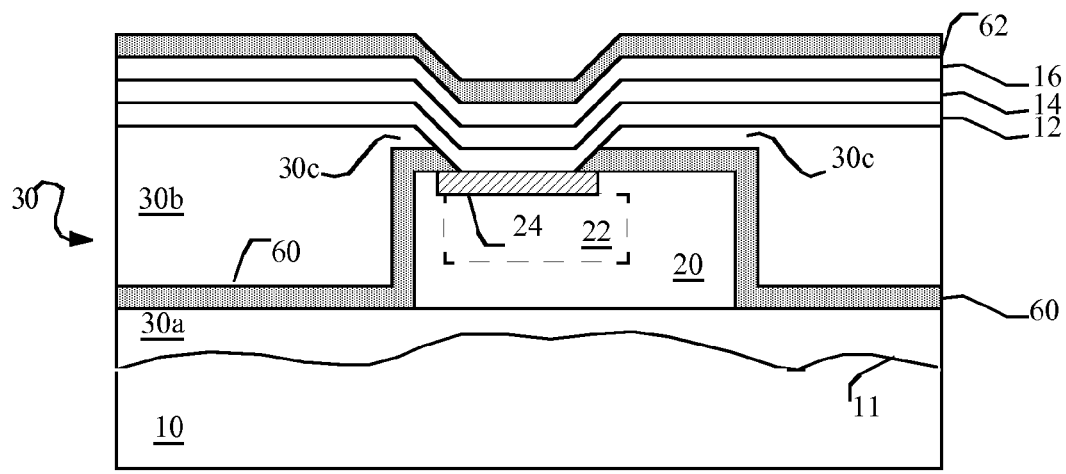
FIGS. 2a, 2b, and 2c are more detailed partial cross-sections of a device having encapsulation layers according to alternative embodiments of the present invention.
Figure 2B:
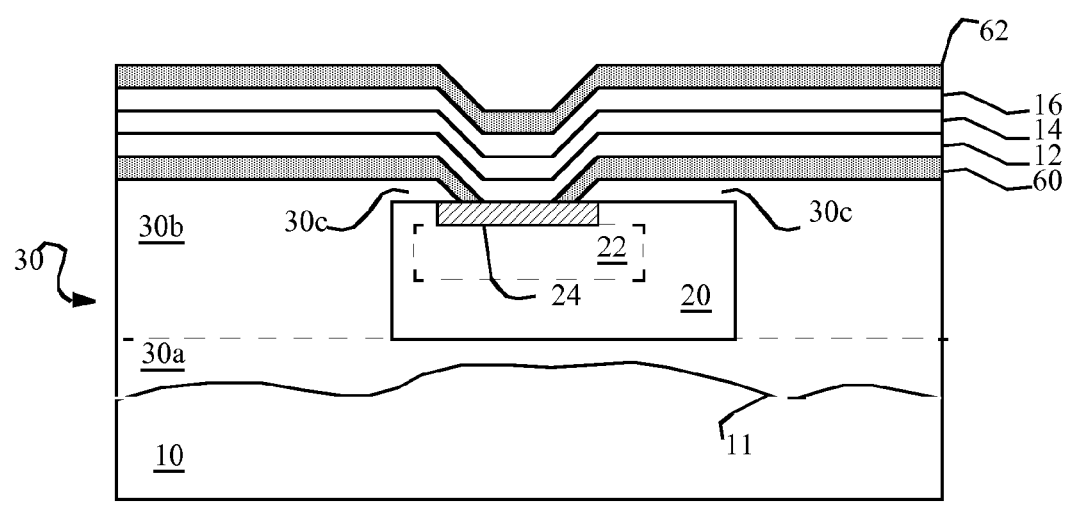

Referring to FIGS. 2a and 2b, in further embodiments of the present invention, bottom and top encapsulating layers 60, 62 can be employed to reduce the permeation of moisture or oxygen into the LED 15. Since organic materials (for example forming an organic LED or OLED) can be employed in an embodiment of the present invention, and such organic materials degrade in the presence of such environmental contaminants, such encapsulating layers can improve the lifetime of the flexible emissive display 1. Encapsulating layers are known in products used for substrates and covers. However, such products can be inadequate for some OLED applications and, furthermore, are subject to failure when stressed by flexing. Hence, additional protective layers can be helpful. One or more bottom encapsulating layer 60 can include inorganic materials located within the organic low-temperature adhesion layer 30 and over at least a portion of the chiplets 20. For example, the bottom encapsulation layer 60 can be formed over portion 30a of the organic low-temperature adhesion layer 30 and a portion of the chiplet 20, as illustrated in FIG. 2a.

In an alternative embodiment illustrated in FIG. 2b, the bottom encapsulation layer 60 is formed over the entire organic low-temperature adhesion layer 30 and over at least a portion of the chiplet 20. The top encapsulation layer 62 can be formed over the top electrode 16. Top and bottom encapsulation layers 62, 60 can include, for example, silicon oxides, silicon nitrides, and metals. Multiple layers can be used. The top and bottom encapsulation layers 62, 60 can be deposited using a variety of methods, for example, sputtering, chemical vapor deposition (CVD), or atomic layer deposition (ALD).

Figure 2C:
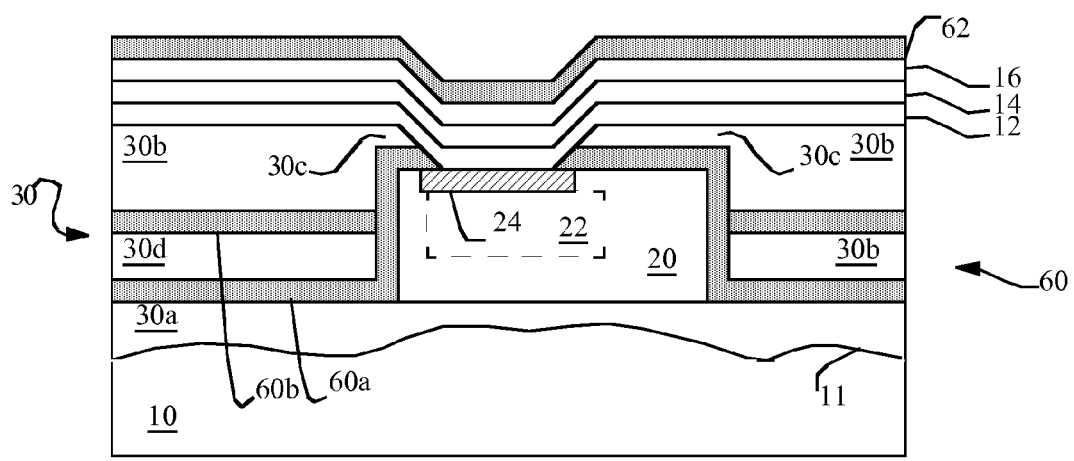

Referring to FIG. 2c, the organic, low-temperature adhesion layer 30 can include a multi-layer having multiple layers alternating with multiple bottom encapsulating layers 60. For example, the first adhesion layer 30a can be formed, the chiplets 20 adhered to the first adhesion layer, a first bottom encapsulating layer deposited 60a, a second adhesion layer 30d formed over the first bottom encapsulating layer 60a, a second bottom encapsulating layer 60b deposited, a third adhesion layer 30b formed over the second bottom encapsulating layer 60b, and so on. Since the bottom encapsulating layers 60 are typically very thin (less than one micron) and the overall organic low-temperature adhesion layer 30 relatively thick (for example 10 microns or more), several alternating layers of bottom encapsulating layers and organic low-temperature adhesion layers are readily formed over the substrate 10.

Contact can be made to the connection pads 24 of the chiplets 20 by using photolithographic methods to form vias through the organic low-temperature adhesion layer 30 and the bottom encapsulation layer 60 (if present).

In a bottom emitter embodiment of the present invention, the bottom electrode 12 and the flexible rough substrate 10 are transparent. In a top emitter embodiment of the present invention, the top electrode 16 and the flexible encapsulating layer 50 are transparent. If either the top or bottom electrodes 16, 12 are transparent, they can include transparent conducting oxides, such as ITO, deposited by sputtering. If either the top or bottom electrodes 16, 12 are not necessarily transparent, they can include a metal, such as aluminum deposited by evaporation or sputtering. In either case, a metal wire 13 can be, but is not necessarily, used to electrically connect the connection pads 24 to the bottom electrodes 12.

In a further embodiment of the present invention, the formation of one or more of the chiplets 20, the top or bottom electrodes 16, 12, the one or more light-emitting layers 14, and the top or bottom encapsulation layers 62, 60 (if present) can be done while the flexible rough substrate 10 is under mechanical stress. In one embodiment of the present invention, the substrate mechanical stress is tensile. By placing these elements under mechanical stress, when the flexible emissive device 1 is mechanically stressed in an appropriate direction complementing the original stress, the elements can relax and thereby continue to operate while under greater amounts of mechanical stress.

In further embodiments of the present invention, the various layers of the flexible emissive device can have similar materials or thickness. Such similarities can reduce material and process costs and variability, and provide greater resistance to stress by locating the neutral stress plane of the flexible emissive device 1 close to the LED 15 and chiplet 20 elements, or possibly the bottom or top encapsulating layers. For example, in one embodiment the polymer buffer layer 40 (if present) can include a similar material or have a similar thickness D4 to the organic low-temperature adhesion layer 30 with thickness D2. Alternatively, in another embodiment, the flexible rough substrate 10 and the flexible encapsulating layer 50 include a similar material or have a similar thickness D1, D5. Furthermore, mechanical modeling indicates that improved resistance to stress in the LED 15 and chiplet 20 elements can be obtained by an embodiment in which the flexible rough substrate 10 is more flexible than the organic low-temperature adhesion layer 30.

According to embodiments of the present invention, in order to provide a mechanically robust and flexible implementation, the flexible rough substrate 10 and flexible encapsulating layer 50 are substantially thicker (D1, D5) than the organic low-temperature adhesion layer 30 and optional buffer layer 40 (D2, D4). The organic low-temperature adhesion layer 30 and optional buffer layer 40 are likewise substantially thicker (D2, D4) than the electrodes 12, 16, and material layers 14 (D3). By substantially thicker is meant that the thickness is at least two times thicker and preferably five times thicker. In some embodiments, substantially thicker can mean ten times thicker or more. For example, in various embodiments of the present invention, the flexible rough substrate 10 and flexible encapsulating layer 50 can be 100 microns to 2 mm thick. The organic low-temperature adhesion layer 30 and buffer layer 40 can be two microns thick, ten microns thick, 20 microns thick, or 50 microns or more thick. The electrode and light-emitting layers 12, 16, 14, are typically less than two microns thick and preferably less than one micron thick.

Inorganic elements on a flexible substrate are subject to failure from cracking, slipping, or delamination. By locating the chiplets 20 within the organic low-temperature adhesion layer 30 with at least a portion 30c of the organic low-temperature adhesion layer 30 extending above a portion of the chiplets 20, the problems of slipping and delamination are reduced. In particular, having the chiplets 20 within the organic low-temperature adhesion layer 30 (i.e. 30b) reduces the problem of slipping so that the chiplets 20 cannot slide along the surface of the organic low-temperature adhesion layer portion 30a. Having a portion 30c of the organic low-temperature adhesion layer 30 extending above at least a portion of the chiplets 20 reduces the problem of delamination so that the chiplet 20 cannot be readily peeled from the organic low-temperature adhesion layer 30.

In one embodiment of the present invention, the flexible rough substrate 10 is more flexible than the organic low-temperature adhesion layer 30. By more flexible is meant that the elastic modulus is smaller. In another embodiment of the present invention, the flexible encapsulating layer 50 is more flexible than the polymer buffer layer 40 (if present). In yet embodiment of the present invention, the organic low-temperature adhesion layer 30 is more flexible than the chiplet 20. By requiring that the flexible substrate 10 and flexible encapsulation layer 50 are more flexible than the organic low-temperature adhesion layer 30 and optional polymer buffer layer 40, stress is reduced in the adhesion and optional polymer buffer layers 30, 40 respectively. By requiring that the organic low-temperature adhesion layer 30 be more flexible than the chiplets 20 and, in turn, the flexible substrate 10 be more flexible than the organic low-temperature adhesion layer 30, stress and cracking, as well as slipping and delamination, are reduced in the chiplet 20. Since the chiplet 20 is a critical element in controlling the light emitter, reducing the stress in the chiplet 20 (and connections to the chiplet from the connection pads 24) will improve the performance of the flexible emissive display device 1 under stress. Likewise, by requiring that the optional polymer buffer layer 40 be less flexible than the flexible encapsulating layer 50, the stress is reduced in the thin electrodes 12, 16 and one or more material layers 14. Since failure in these layers can cause failure in pixels or in the entire flexible emissive display device 1, reducing the stress in the polymer buffer layer 40 will improve the performance of the flexible emissive display device 1 under stress.

According to an embodiment of the present invention, one or more layers of wires 13 can form a buss 28. The buss 28 is connected to chiplet connection pads 24 to provide signals to the chiplets from an external controller 26 (for example, power, ground, data, and select signals) are formed over the organic low-temperature adhesion layer 30. In a preferred embodiment, a single layer of wires 13 is employed. Since the conductivity of the wires 13 can be affected by stress, providing the wires 13 above the organic low-temperature adhesion layer 30 reduces the stress experienced by the wires when the flexible emissive display device 1 is flexed. The optional encapsulation layer 60 can be formed over the wires 13.

In either a top-emitter or a bottom-emitter configuration, an optional color filter can be employed to filter the light emitted by the one or more material layers 14. A color filter can be formed between at least a portion of the flexible rough substrate 10 and the bottom electrode 12. The color filter can be formed directly on a portion of the flexible substrate 10 or on portions of other layers formed over the flexible rough substrate 10. In a top-emitter embodiment, a color filter can be located on a flexible cover or directly on the top electrode. In a display device, multiple color filters can be employed with multiple chiplets and multiple, independently controlled, bottom electrodes 12 to make multiple pixel elements having differently colored sub-pixels. The color filters are especially useful in the case in which the light-emitting materials are not patterned over the flexible substrate. Alternatively, different light-emitting materials can be patterned over the flexible substrate in correspondence with the bottom electrode, each light-emitting material emitting a different color of light, to form a multi-colored display.

In various embodiments of the present invention, the bottom electrode 12 can be formed in a common step with wires 13 including busses 28 or bottom electrode connections, thereby reducing manufacturing costs. One or more busses 28 can be formed over the flexible rough substrate 10 and the busses 28 formed in a common step with the bottom electrode 12. A buss-insulating layer can be formed between the one or more busses 28 and the bottom electrode 12. An encapsulating layer can be located above or below or within the buss-insulating layer. A chiplet-insulating layer can be formed over the chiplet and connection pads and beneath the one or more light-emitting layers 14 or the top electrode 16. The buss-insulating layer can be formed in a common step with the chiplet-insulating layer. By forming elements of the present invention in common steps, processing steps and costs are reduced. Likewise the wire 13 formed between the connection pad on the chiplet and the bottom electrode can be formed either before the bottom electrode 12, after the bottom electrode 12, or most desirably, in the same step as the bottom electrode 12 in order to reduce processing steps and cost.

The flexible substrate 10 can include glass. Wires and top or bottom electrodes 16, 12, can be made of evaporated or sputtered metal, e.g. aluminum or silver, or metal alloy. The chiplet 20 can be formed using conventional techniques well established in the integrated circuit industry and located over the substrate 10 using methods described in co-pending, commonly assigned, U.S. patent application Ser. No. 12/191,478.

Chiplets are separately manufactured from the flexible rough substrate 10 and then applied to the flexible rough substrate 10. The chiplets 20 are preferably manufactured using silicon or silicon on insulator (SOI) wafers using known processes for fabricating semiconductor devices. Each chiplet 20 is then separated prior to attachment to the flexible rough substrate 10. The crystalline base of each chiplet 20 can therefore be considered a substrate separate from the flexible rough substrate 10 and in which the chiplet's circuitry 22 is formed. In particular, the independent substrate is separate from the flexible rough substrate 10 on which pixels are formed and the areas of the independent, chiplet substrates for a multi-chiplet device, taken together, are smaller than the flexible rough substrate 10. Chiplets 20 can have a crystalline substrate to provide higher performance active components than are found in, for example, thin-film amorphous or polycrystalline silicon devices. Chiplets 20 can have a thickness preferably of 100 µm or less, and more preferably 20 µm or less. This facilitates formation of the organic low-temperature adhesion layer 30 over a portion 30c of the chiplet 20.

Since the chiplets 20 are formed in a semiconductor substrate, the circuitry 22 of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. Therefore, the circuitry of the chiplet for driving the pixels, such as the two transistors for each pixel, can be made small. The chiplet, however, also requires connection pads for making electrical connection to the wiring layer provided over the chiplets once assembled onto the display substrate. The connection pads must be sized based on the feature size of the lithography tools used on the flexible rough substrate (for example 5 µm) and the alignment of the chiplets to the wiring layer (for example +/−5 µm). Therefore, the connection pads 24 can be, for example, 15 µm wide with 5 µm spaces between the pads. This shows that the pads will generally be significantly larger than the transistor circuitry formed in the chiplet.

The connection pads 24 can generally be formed in a metallization layer on the chiplet 20 over the transistors. It is desirable to make the chiplet with as small a surface area as possible to enable a low manufacturing cost. Therefore, the size and number of the connection pads 24 and not the transistors can limit the size of the chiplet 20.

As shown in FIG. 3, the present invention can be employed in devices having a multi-pixel or multi-chiplet infrastructure and can be employed in either an active-matrix configuration in which the chiplet has circuitry that controls each pixel as an active-matrix element or as a passive-matrix controller. The present invention provides advantages when decreased costs and improved performance are important. In particular, the present invention can be practiced with active-matrix LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292 to Tang et al., and U.S. Pat. No. 5,061,569, to Van Slyke et al. Inorganic devices, for example, employing quantum dots formed in a polycrystalline semiconductor matrix (for example, as taught in U.S. Patent Application Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top-emitter architecture or bottom-emitter architecture.

The invention has been described in detail with particular reference to certain preferred embodiments thereof, but it should be understood that variations and modifications could be effected within the spirit and scope of the invention.

PARTS LIST

D1, D2, D3, D4, D5 layer thickness
1 flexible emissive display
10 flexible, rough substrate
11 rough substrate
12 bottom electrode
13 metal wire
14 one or more layers of light-emitting material
15 light-emitting diode
16 top electrode
20 chiplet
21 display area
22 circuitry
24 connection pad
26 controller
28 buss
30 organic low-temperature adhesion layer
30a, 30b, 30c, 30d sublayer portions of multi-layer organic low-temperature adhesion layer
40 polymer buffer layer
50 flexible encapsulating layer
60, 60a, 60b encapsulating layer
62 encapsulating layer

The invention claimed is:

1. A flexible emissive device, comprising:
    (a) a flexible rough substrate having a rough substrate surface and defining a display area;
    (b) an organic low-temperature adhesion layer formed on the rough substrate surface, at least a portion of the organic low-temperature adhesion layer having a thickness greater than or equal to five microns;
    (c) a plurality of chiplets distributed in the display area and adhering to the organic low-temperature adhesion layer, each chiplet having one or more connection pads;
    (d) a plurality of patterned bottom electrodes formed over the organic low-temperature adhesion layer in the display area, each bottom electrode being electrically connected to only one connection pad of a corresponding chiplet; one or more layers of light-emitting material formed over the bottom electrode; and a top electrode formed over the one or more layers of light-emitting material; and (e) a flexible encapsulating layer located over the top electrode and adhered to the rough substrate surface.

2. The flexible emissive device of claim 1, wherein the rough substrate degrades at a temperature greater than 200° C.

3. The flexible emissive device of claim 1, wherein the rough surface of the substrate has an rms roughness of 100 Angstroms or greater.

4. The flexible emissive device of claim 1, wherein the organic low-temperature adhesive layer extends over a portion of the chiplets.

5. The flexible emissive device of claim 1, wherein the organic low-temperature adhesion layer is a multi-layer that includes two or more layers, the first layer adhering the chiplets to the rough substrate surface and the second layer burying at least a portion of the chiplet.

6. The flexible emissive device of claim 5, further comprising one or more bottom encapsulation layers located within the organic low-temperature adhesion layer over the first layer and over at least a portion of the chiplets.

7. The flexible emissive device of claim 1, wherein the flexible substrate is a metal, a steel foil, or comprises a polymer.

8. The flexible emissive device of claim 1, further comprising a bottom encapsulation layer located over the organic low-temperature adhesion layer and over at least a portion of the chiplets.

9. The flexible emissive device of claim 1, wherein the organic low-temperature adhesion layer is a curable polymer.

10. The flexible emissive device of claim 1, wherein the organic low-temperature adhesion layer is flexible.

11. The flexible emissive device of claim 1, further comprising a polymer buffer layer formed between the top electrode and the flexible encapsulation layer.

12. The flexible emissive device of claim 11, wherein the polymer buffer layer comprises a similar material or has a similar thickness to the organic low-temperature adhesion layer.

13. The flexible emissive device of claim 1, wherein the flexible substrate and the flexible encapsulating layer comprise a similar material or have a similar thickness.

14. The flexible emissive device of claim 1, wherein the flexible substrate is more flexible than the organic low-temperature adhesion layer.

15. A method of making a flexible emissive device, comprising:

(a) providing a flexible rough substrate having a rough substrate surface and defining a display area;

(b) depositing an organic low-temperature adhesion layer on the rough substrate surface, at least a portion of the organic low-temperature adhesion layer having a thickness greater than or equal to five microns;

(c) providing a plurality of chiplets distributed in the display area and adhering the chiplets to the organic adhesive layer, each chiplet having one or more connection pads;

(d) bending the flexible rough substrate;

(e) providing a plurality of patterned bottom electrodes formed over the organic low-temperature adhesion layer in the display area on the bent substrate, each bottom electrode being electrically connected to only one connection pad of a corresponding chiplet; one or more layers of light-emitting material formed over the bottom electrode on the bent substrate; and a top electrode formed over the one or more layers of light-emitting material on the bent substrate; and (f) providing a flexible encapsulating layer located over the top electrode and adhered to the rough substrate surface.

16. The method of making a flexible emissive device of claim 15, wherein steps (b) and (c) are performed while the flexible rough substrate is bent.

17. The method of making a flexible emissive device of claim 15, wherein the flexible rough substrate is bent so that the surface on which the patterned bottom electrodes are provided is in tension.

18. The method of making a flexible emissive device of claim 15, further comprises providing a polymer buffer layer over the top electrode and beneath the flexible encapsulating layer, the polymer buffer layer having similar materials or thickness as the organic low-temperature adhesion layer.

19. The method of making a flexible emissive device of claim 18, wherein the step of providing a polymer buffer layer over the top electrode and beneath the flexible encapsulating layer, is performed while the substrate is bent.

* * * * *